(12) United States Patent
D'Eliseo et al.

(10) Patent No.: US 11,886,346 B2
(45) Date of Patent: Jan. 30, 2024

(54) CACHE READ CONTEXT SWITCHING IN A MEMORY SUB-SYSTEM

(71) Applicant: Micron Technology, Inc., Boise, ID (US)

(72) Inventors: Giuseppe D'Eliseo, Avezzano (IT); Anna Scalesse, Avezzano (IT); Umberto Siciliani, Rubano (IT); Carminantonio Manganelli, Avezzano (IT)

(73) Assignee: Micron Technology, Inc., Boise, ID (US)

( * ) Notice: Subject to any disclaimer, the term of this patent is extended or adjusted under 35 U.S.C. 154(b) by 265 days.

(21) Appl. No.: 17/302,067

(22) Filed: Apr. 22, 2021

(65) Prior Publication Data

US 2022/0342823 A1 Oct. 27, 2022

(51) Int. Cl.
*G06F 12/00* (2006.01)
*G06F 12/0844* (2016.01)
*G06F 3/06* (2006.01)

(52) U.S. Cl.
CPC ........ *G06F 12/0844* (2013.01); *G06F 3/0659* (2013.01); *G06F 2212/1021* (2013.01)

(58) Field of Classification Search
CPC ......... G06F 12/0844; G06F 2212/1021; G06F 12/0238; G06F 3/0659; G06F 3/0683; G06F 9/3836
See application file for complete search history.

(56) References Cited

U.S. PATENT DOCUMENTS

| 2018/0039447 A1* | 2/2018 | Lee ..................... G06F 11/1064 |
| 2019/0310795 A1* | 10/2019 | Mathada ................ G11C 16/26 |
| 2019/0354498 A1* | 11/2019 | Ebsen ................ G06F 13/1626 |
| 2020/0125293 A1* | 4/2020 | Park ..................... G06F 3/0659 |
| 2022/0179568 A1* | 6/2022 | Shah ..................... G11C 16/10 |

\* cited by examiner

*Primary Examiner* — Shawn X Gu
(74) *Attorney, Agent, or Firm* — Lowenstein Sandler LLP

(57) ABSTRACT

A memory device includes a memory array configured with a plurality of memory planes, and control logic, operatively coupled with the memory array. The control logic receives, from a requestor, a plurality of cache read commands requesting first data from the memory array spread across the plurality of memory planes and receives, from the requestor, a cache read context switch command and a snap read command requesting second data from one of the plurality of memory planes of the memory array. Responsive to receiving the cache read context switch command, the control logic suspends processing of the plurality of cache read commands and processes the snap read command to read the second data from the memory array and return the second data to the requestor.

19 Claims, 8 Drawing Sheets

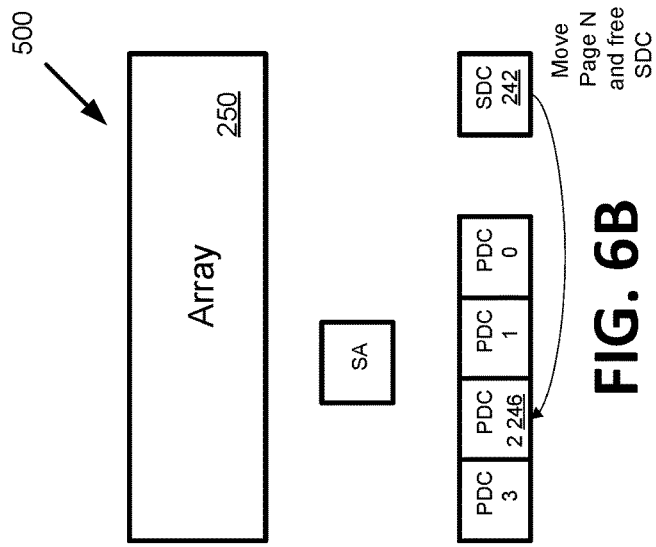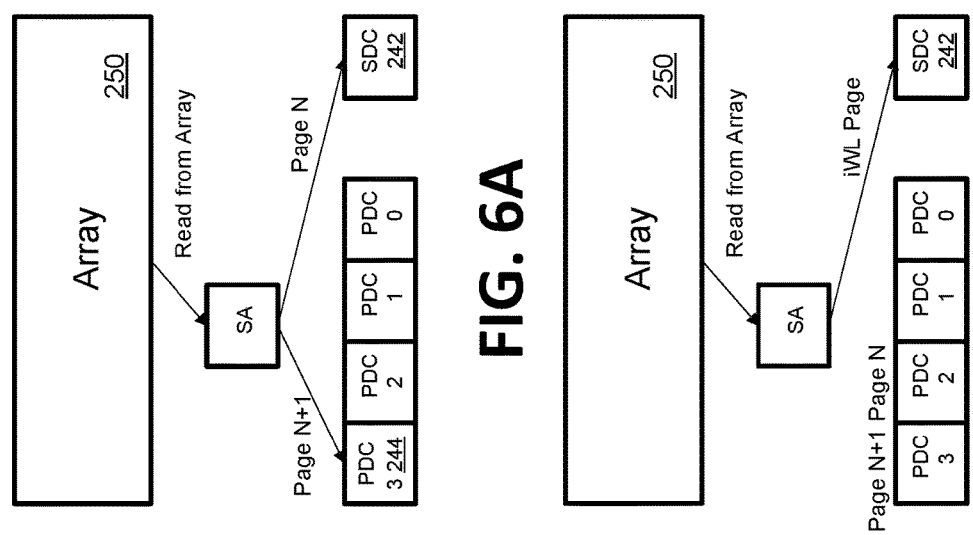

US 11,886,346 B2

CACHE READ CONTEXT SWITCHING IN A MEMORY SUB-SYSTEM

TECHNICAL FIELD

Embodiments of the disclosure relate generally to memory sub-systems, and more specifically, relate to cache read context switching in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIGS. 6A-6D are block diagrams illustrating cache read context switching in a memory device in accordance with some embodiments of the present disclosure.

DETAILED DESCRIPTION

Figure 1:
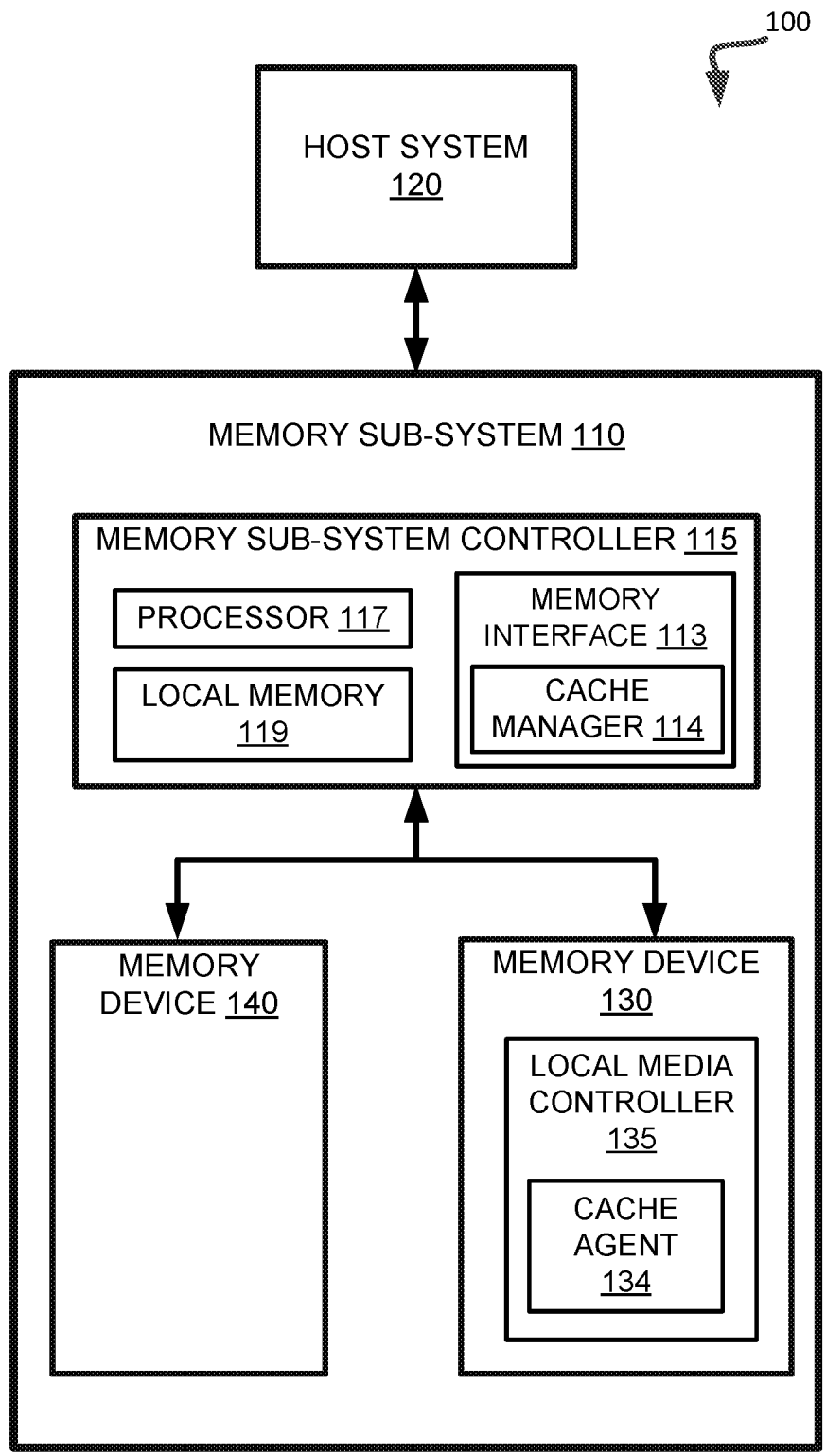
FIG. 1 illustrates an example computing system that includes a memory sub-system in accordance with some embodiments of the present disclosure.

Aspects of the present disclosure are directed to use of a cache release command for cache reads in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional or a three-dimensional grid. Memory cells are etched onto a silicon wafer in an array of columns (also hereinafter referred to as bitlines) and rows (also hereinafter referred to as wordlines). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include multiple access line driver circuits and power circuits that can be shared by the planes of the memory device to facilitate concurrent access of pages of two or more memory planes, including different page types. For ease of description, these circuits can be generally referred to as independent plane driver circuits. Depending on the storage architecture employed, data can be stored across the memory planes (i.e., in stripes). Accordingly, one request to read a segment of data (e.g., corresponding to one or more data addresses), can result in read operations performed on two or more of the memory planes of the memory device.

Certain memory devices are coupled with a memory sub-system controller, which can send a read command or a cache read command to the memory devices through a command queue. When such a command is processed, there is a delay period, referred to herein as the cache read latency time (tRCBSY), which occurs before the requested data can be returned to the requestor (e.g., the memory sub-system controller). During this delay period, the requested data is relocated internally within the memory device. For example, the data can be copied from a memory array (e.g., including multiple planes) of the memory device to a page cache of the memory device. When a cache read command is being processed, data can be written first to a data register of the page cache and then from the data register to a cache register of the page cache, from where the data can be output to the requestor. When a general read command is being processed, data can be written directly to the cache register and from there to the requestor (i.e., bypassing the data register). If, for example, the data from a previous read command or cache read command was read from the array and stored in the data register, during the delay period (e.g., tRCBSY) of the next cache read command, the data is copied from the data register before it is output to the requestor. This delay period, to allow for internal data transfer which decreases latency of cache read commands with respect to read commands, increases the overall latency of the read operation, which negatively impacts the overall performance of the memory sub-system.

When other types of read commands that are different from a cache read command, such as snap read commands are received from the requestor the memory device can process them differently. As compared to a full page read command, a snap read can be designed for smaller workloads (i.e., limited to a certain amount of data that can be accessed in a single operation), but can be completed faster (i.e., has a shorter read time). In addition, since snap read commands are associated with an expected higher quality of service (QoS), the memory device can take measures to reduce the read latency time. For example, when placed in the command queue, the snap read commands can have an indication of a higher priority than cache read commands, and when processed, the requested data can be copied from the memory array directly to a cache register of the page cache, and then output to the requestor. When such a snap read command is received from the host system in the middle of, or after, a long sequential read flow (e.g., a series of multiple cache read commands), the command queue of the memory sub-system controller can be filled with the lower priority commands. This can prevent the higher priority snap read commands from being placed in the command queue unless a separate terminate cache command is issued before the snap read command actually breaking the cache read pipeline (i.e., the cache register and the data register). Thus, these memory devices are limited to either aborting all of the already enqueued cache read commands in the command queue, processing the terminate cache and snap read commands, and then restoring the previous cache read commands, or simply waiting until all of the pending cache read commands are processed and then processing the snap read command. These approaches, however, increase the complexity of the firmware design of the requestor (e.g., the memory sub-system controller) and increase the associated latency for processing the snap read command, respectively.

Aspects of the present disclosure address the above and other deficiencies by implementing a cache read context switch command for cache read context switching in a memory sub-system. In one embodiment, the cache read context switch command is issued by the requestor and received by a memory device in the memory sub-system, and allows for the suspension of pending memory access commands, such as cache read commands, from a command queue of the requestor. Upon receiving the cache read context switch command, control logic in the memory device can receive and process a snap read command without overwriting cache read data in the page buffer and without the latency introduced by the terminate cache command. For example, the control logic can move any data in the cache register of the page buffer corresponding to a cache read command to the data register of the page buffer, so that data associated with the snap read command can be copied from the memory array directly to the cache register, and then transferred to the requestor. In one embodiment, the cache read context switch command and snap read command are enqueued in the command queue of the memory sub-system controller with an indication of a higher priority than other cache read commands. This higher priority allows the corresponding commands to be processed before the lower priority commands, even though the lower priority commands may have been received and enqueued before the high priority commands. Upon execution of the snap read command or commands, a cache read context restore command can be processed to revert to the prior context and resume execution of the pending cache read commands or newly received cache read commands.

Advantages of this approach include, but are not limited to, improved performance in the memory sub-system. In the manner described herein, a snap read command can be processed with reduced latency as only a currently executing cache read command need complete before the snap read command is processed, rather than waiting for all previously received and pending cache read commands to complete. Such latency reduction can be achieved without additional firmware overhead and complexity in the memory sub-system controller and without having to abort and restart all pending cache read commands. Accordingly, the quality of service for certain high priority read commands is improved and the overall read throughput of the memory sub-system is increased.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface, Open NAND Flash Interface (ONFI) interface, or some other interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113, which includes cache manager 114. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the cache manager 114. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system. In one embodiment, memory interface 113 includes cache manager 114, among other sub-components. Cache manager 114 can direct memory access commands, such as a read command, a cache read command, a snap read command, a cache read context switch command, or a cache reach context restore command, to memory device 130. In one embodiment, memory device 130 includes a cache agent 134 configured to carry out corresponding memory access operations, in response to receiving the memory access commands from cache manager 114. In some embodiments, local media controller 135 includes at least a portion of cache agent 134 and is configured to perform the functionality described herein. In some embodiment, cache agent 134 is implemented on memory device 130 using firmware, hardware components, or a combination of the above.

In one embodiment, cache agent 134 receives, from a requestor, such as cache manager 114, a series of multiple cache read commands (e.g., sequential read commands) requesting first data from a memory array of memory device 130 and spread across multiple memory planes. Cache agent 134 further receives, from the requestor, a cache read context switch command and a snap read command requesting second data from one of the plurality of memory planes of the memory array of memory device 130. Responsive to receiving the cache read context switch command, cache agent 134 can suspend processing of the plurality of cache read commands and being processing the snap read command to read the second data from the memory array and return the second data to the requestor. Further details with regards to the operations of cache manager 114 and cache agent 134 are described below.

Figure 2A:
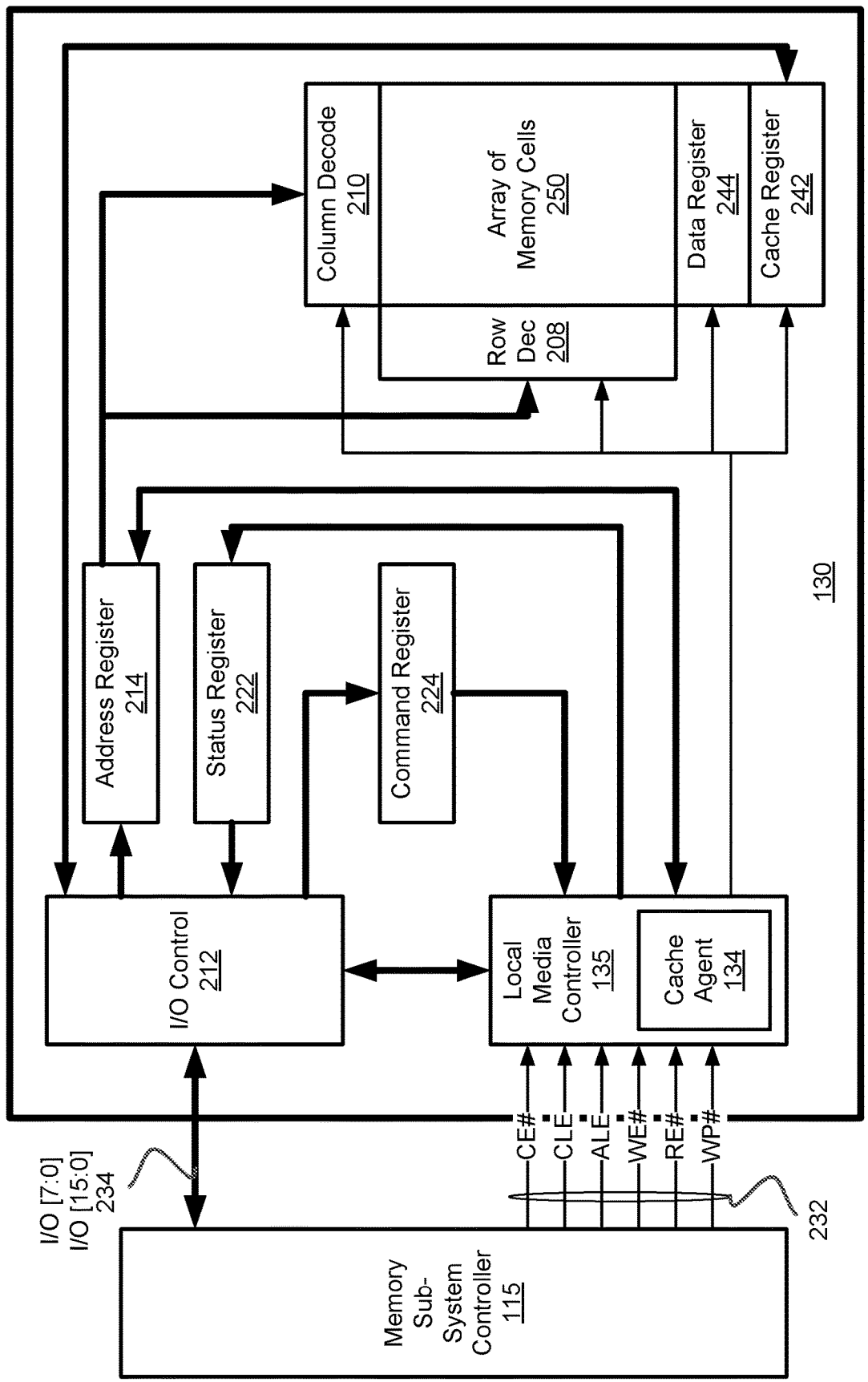
FIG. 2A is a block diagram of a memory device in communication with a memory sub-system controller of a memory sub-system, according to an embodiment.

FIG. 2A is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 250 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2A) of at least a portion of array of memory cells 250 are capable of being programmed to one of at least two target data states.

Row decode circuitry 208 and column decode circuitry 210 are provided to decode address signals. Address signals are received and decoded to access the array of memory cells 250. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and local media controller 135 to latch incoming commands.

A controller (e.g., the local media controller 135 internal to the memory device 130) controls access to the array of memory cells 250 in response to the commands and generates status information for the external memory sub-system controller 115, i.e., the local media controller 135 is configured to perform access operations (e.g., read operations, programming operations and/or erase operations) on the array of memory cells 250. The local media controller 135 is in communication with row decode circuitry 208 and column decode circuitry 210 to control the row decode circuitry 208 and column decode circuitry 210 in response to the addresses. In one embodiment, local media controller 135 includes cache agent 134, which can implement the cache read context switching of memory device 130, as described herein.

The local media controller 135 is also in communication with a cache register 242. Cache register 242 latches data, either incoming or outgoing, as directed by the local media controller 135 to temporarily store data while the array of memory cells 250 is busy writing or reading, respectively, other data. During a program operation (e.g., write operation), data may be passed from the cache register 242 to the data register 244 for transfer to the array of memory cells 250; then new data may be latched in the cache register 242 from the I/O control circuitry 212. During a read operation, data may be passed from the cache register 242 to the I/O control circuitry 212 for output to the memory sub-system controller 115; then new data may be passed from the data register 244 to the cache register 242. The cache register 242 and/or the data register 244 may form (e.g., may form a portion of) a page buffer of the memory device 130. A page buffer may further include sensing devices (not shown in FIG. 2A) to sense a data state of a memory cell of the array of memory cells 250, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 242. The data may be subsequently written into data register 244 for programming the array of memory cells 250.

In an embodiment, cache register 242 may be omitted, and the data may be written directly into data register 244. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2A has been simplified. It should be recognized that the functionality of the various block components described with reference to FIG. 2A may not necessarily be segregated to distinct components or component portions of an integrated circuit device. For example, a single component or component portion of an integrated circuit device could be adapted to perform the functionality of more than one block component of FIG. 2A. Alternatively, one or more components or component portions of an integrated circuit device could be combined to perform the functionality of a single block component of FIG. 2A. Additionally, while specific I/O pins are described in accordance with popular conventions for receipt and output of the various signals, it is noted that other combinations or numbers of I/O pins (or other I/O node structures) may be used in the various embodiments.

Figure 2B:
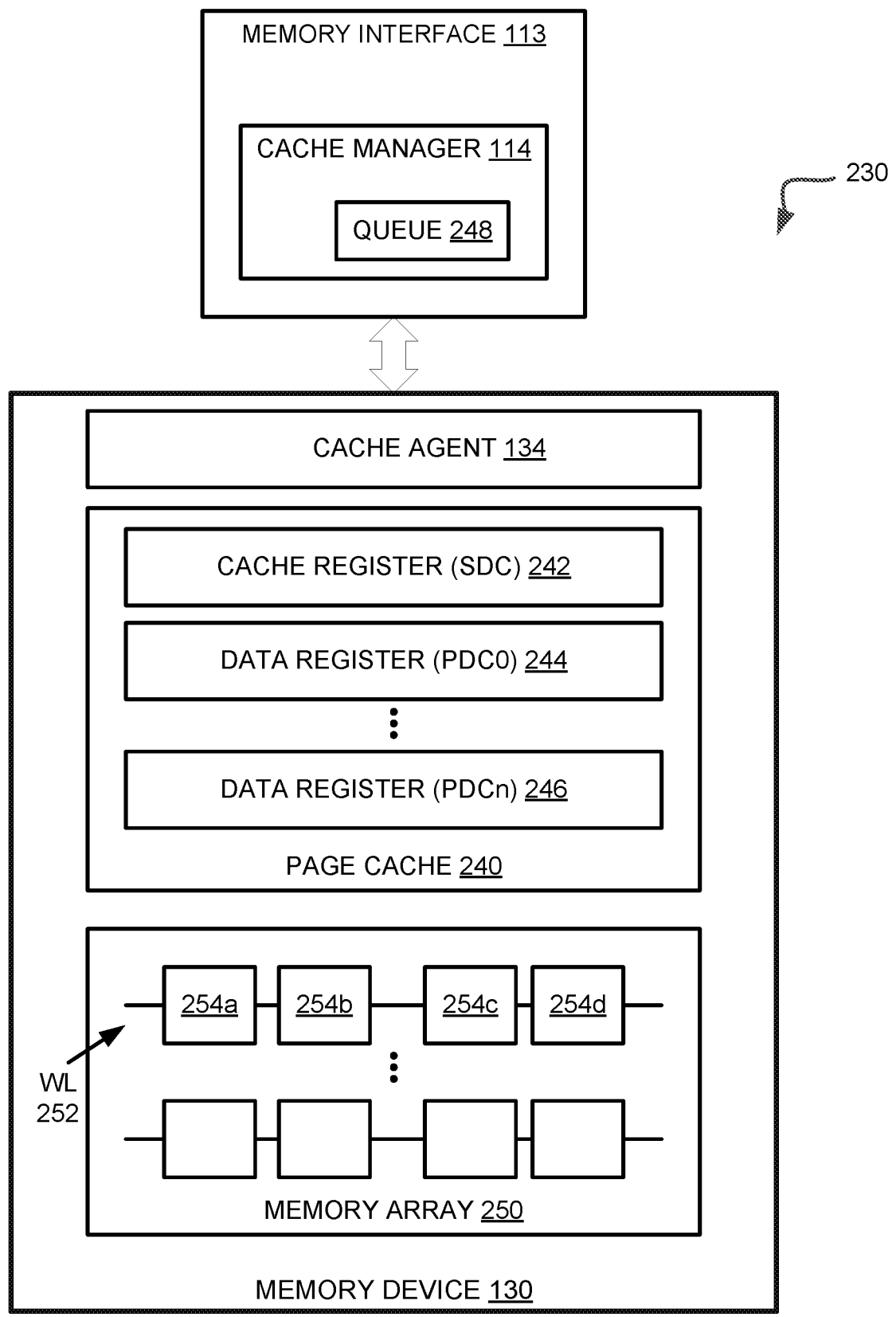
FIG. 2B is a block diagram 230 illustrating a memory sub-system implementing cache read context switching in a memory device in accordance with some embodiments of the present disclosure.

FIG. 2B is a block diagram 230 illustrating a memory sub-system implementing cache read context switching in a memory device in accordance with some embodiments of the present disclosure. In one embodiment, memory interface 113 is operatively coupled with memory device 130. In one embodiment, memory device 130 includes a page cache 240 and a memory array 250. Memory array 250 can include an array of memory cells formed at the intersections of wordlines, such as wordline 252, and bitlines (not shown). In one embodiment, the memory cells are grouped in to blocks, which can be further divided into sub-blocks, where a given wordline, such as wordline 252, is shared across a number of sub-blocks 254a, 254b, 254c, 254d, for example. In one embodiment, each sub-block corresponds to a separate plane in the memory array 250. The group of memory cells associated with a wordline within a sub-block is referred to as a physical page. Each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

Depending on the programming scheme used, each logical page of a memory cell can be programmed in a separate programming pass, or multiple logical pages can be programmed together. For example, in a QLC physical page, the LP can be programmed on one pass, and the UP, XP and TP can be programmed on a second pass. Other programming schemes are possible. The page cache 240 is a buffer used to temporarily store data being read from or written to memory array 250 of memory device 130, and can include a cache register 242 and one or more data registers 244-246. For a read operation, the data is read from memory array 250 into one of data registers 244-246, and then into cache register 242. Memory interface 113 can then read out the data from cache register 242. For a program operation, memory interface 113 writes the data to cache register 242, which is then passed to one of data registers 244-246, and finally programmed to memory array 250. If the program operation includes multiple pages (e.g., UP, XP, and TP), each page can have a dedicated data register to hold the corresponding page data.

In one embodiment, cache manager 114 issues a series of multiple cache read commands from command queue 248 (e.g., a hardware queue), which are received by cache agent 134. In one embodiment, the cache read commands are enqueued in the command queue 248 with an indication of low priority and are issued by cache manager 114 to read first data from memory array 250. In one embodiment, cache manager 114 issues a cache read context switch command and a snap read command from command queue 248, which are received by cache agent 134. In one embodiment, the cache read context switch command and a snap read command are enqueued in command queue 248 with an indication of higher priority than the cache read commands. Responsive to receiving the cache read context switch command, cache agent 134 can suspend processing of the received cache read commands. In one embodiment, to suspend processing of the cache read commands, cache agent 134 can move a portion of the first data associated with the cache read commands from the cache register 242 to one of the data registers 244-246. In one embodiment, to process the snap read command, cache agent 134 can copy second data associated with the snap read command from memory array 250 directly to the cache register 242 (i.e., bypassing the one or more data registers 244-246). The second data can be returned to the requestor. In one embodiment, upon receiving the second data associated with the snap read command, cache manager 114 issues a cache read context restore command, which is received by cache agent 134. Responsive to receiving the cache read context restore command, cache agent 134 can resume processing of the cache read commands by moving the portion of the first data associated with the cache read commands from the one of data registers 244-246 back to the cache register 242.

Figure 3:
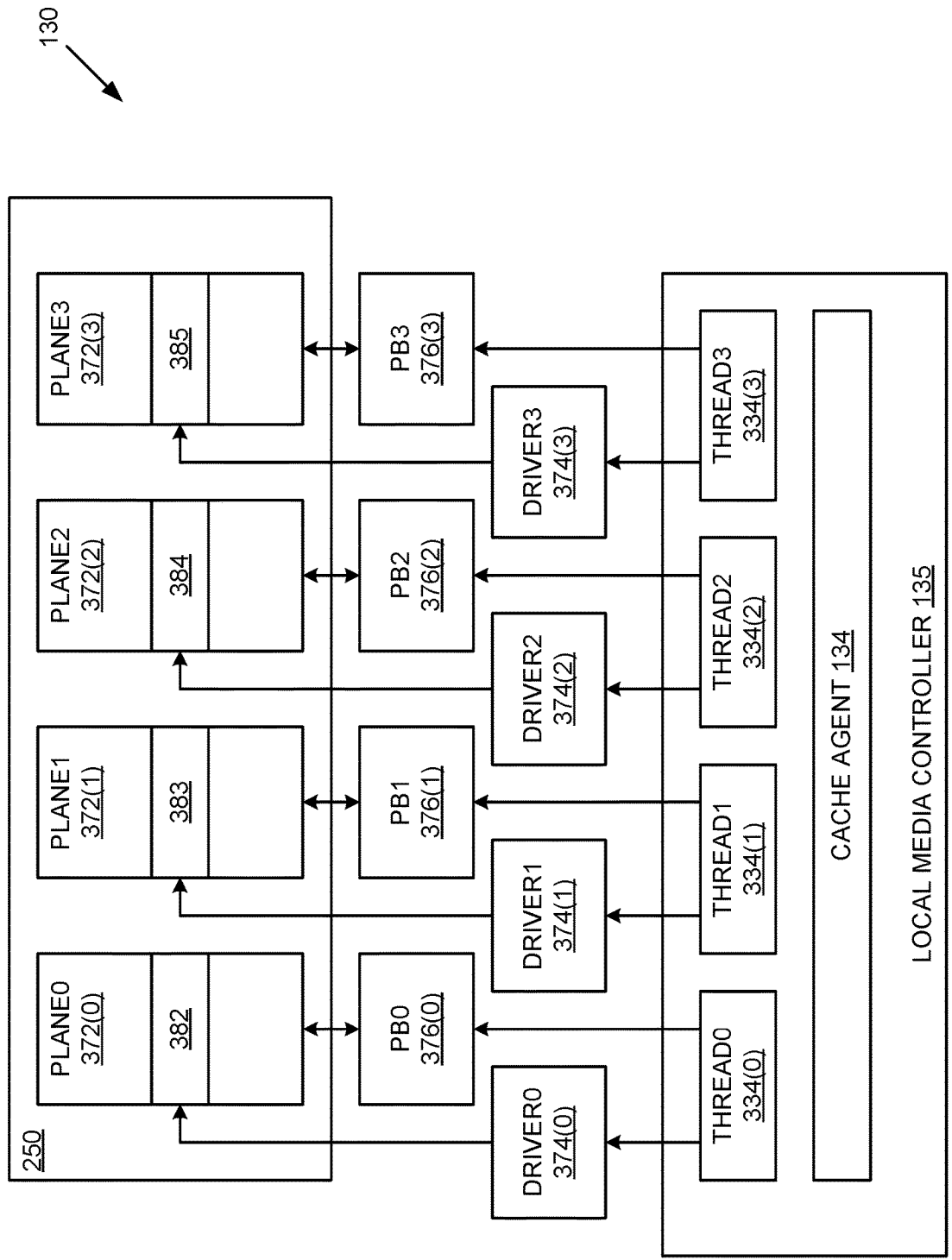
FIG. 3 is a block diagram illustrating a multi-plane memory device configured for parallel plane access in accordance with some embodiments of the present disclosure.

FIG. 3 is a block diagram illustrating a multi-plane memory device 130 configured for independent parallel plane access in accordance with some embodiments of the present disclosure. The memory planes 372(0)-372(3) can each be divided into blocks of data, with a different relative block of data from two or more of the memory planes 372(0)-372(3) concurrently accessible during memory access operations. For example, during memory access operations, two or more of data block 382 of the memory plane 372(0), data block 383 of the memory plane 372(1), data block 384 of the memory plane 372(2), and data block 385 of the memory plane 372(3) can each be accessed concurrently.

The memory device 130 includes a memory array 250 divided into memory planes 372(0)-372(3) that each includes a respective number of memory cells. The multi-plane memory device 130 can further include local media controller 135, including a power control circuit and access control circuit for concurrently performing memory access operations for different memory planes 372(0)-372(3). The memory cells can be non-volatile memory cells, such as NAND flash cells, or can generally be any type of memory cells.

The memory planes 372(0)-372(3) can each be divided into blocks of data, with a different relative block of data from each of the memory planes 372(0)-372(3) concurrently accessible during memory access operations. For example, during memory access operations, data block 382 of the memory plane 372(0), data block 383 of the memory plane 372(1), data block 384 of the memory plane 372(2), and data block 385 of the memory plane 372(3) can each be accessed concurrently.

Each of the memory planes 372(0)-372(3) can be coupled to a respective page buffer 376(0)-376(3). Each page buffer 376(0)-376(3) can be configured to provide data to or receive data from the respective memory plane 372(0)-372(3). The page buffers 376(0)-376(3) can be controlled by local media controller 135. Data received from the respective memory plane 372(0)-372(3) can be latched at the page buffers 376(0)-376(3), respectively, and retrieved by local media controller 135, and provided to the memory sub-system controller 115 via an ONFI interface, for example.

Each of the memory planes 372(0)-372(3) can be further coupled to a respective access driver circuit 374(0)-374(3), such as an access line driver circuit. The driver circuits 374(0)-374(3) can be configured to condition a page of a respective block of an associated memory plane 372(0)-372(3) for a memory access operation, such as programming data (i.e., writing data), reading data, or erasing data. Each of the driver circuits 374(0)-374(3) can be coupled to a respective global access lines associated with a respective memory plane 372(0)-372(3). Each of the global access lines can be selectively coupled to respective local access lines within a block of a plane during a memory access operation associated with a page within the block. The driver circuits 374(0)-374(3) can be controlled based on signals from local media controller 135. Each of the driver circuits 374(0)-374(3) can include or be coupled to a respective power circuit, and can provide voltages to respective access lines based on voltages provided by the respective power circuit. The voltages provided by the power circuits can be based on signals received from local media controller 135.

The local media controller 135 can control the driver circuits 374(0)-374(3) and page buffers 376(0)-376(3) to concurrently perform memory access operations associated with each of a group of memory command and address pairs (e.g., received from memory sub-system controller 115). For example, local media controller 135 can control the driver circuits 374(0)-374(3) and page buffer 376(0)-376(3) to perform the concurrent memory access operations. Local media controller 135 can include a power control circuit that serially configures two or more of the driver circuits 374(0)-374(3) for the concurrent memory access operations, and an access control circuit configured to control two or more of the page buffers 376(0)-376(3) to sense and latch data from the respective memory planes 372(0)-372(3), or program data to the respective memory planes 372(0)-372(3) to perform the concurrent memory access operations.

In operation, local media controller 135 can receive a group of memory command and address pairs via the ONFI bus, with each pair arriving in parallel or serially. In some examples, the group of memory command and address pairs can each be associated with different respective memory planes 372(0)-372(3) of the memory array 250. The local media controller 135 can be configured to perform concurrent memory access operations (e.g., read operations or program operations) for the different memory planes 372(0)-372(3) of the memory array 250 responsive to the group of memory command and address pairs. For example, the power control circuit of local media controller 135 can serially configure, for the concurrent memory access operations based on respective page type (e.g., UP, MP, LP, XP, SLC/MLC/TLC/QLC page), the driver circuits 374(0)-374(3) for two or more memory planes 372(0)-372(3) associated with the group of memory command and address pairs. After the access line driver circuits 374(0)-374(3) have been configured, the access control circuit of local media controller 135 can concurrently control the page buffers 376(0)-376(3) to access the respective pages of each of the two or more memory planes 372(0)-372(3) associated with the group of memory command and address pairs, such as retrieving data or writing data, during the concurrent memory access operations. For example, the access control circuit can concurrently (e.g., in parallel and/or contemporaneously) control the page buffers 376(0)-376(3) to charge/discharge bitlines, sense data from the two or more memory planes 372(0)-372(3), and/or latch the data.

Based on the signals received from local media controller 135, the driver circuits 374(0)-374(3) that are coupled to the memory planes 372(0)-372(3) associated with the group of memory command and address command pairs can select blocks of memory or memory cells from the associated memory plane 372(0)-372(3), for memory operations, such as read, program, and/or erase operations. The driver circuits 374(0)-374(3) can drive different respective global access lines associated with a respective memory plane 372(0)-372(3). As an example, the driver circuit 374(0) can drive a first voltage on a first global access line associated with the memory plane 372(0), the driver circuit 374(1) can drive a second voltage on a third global access line associated with the memory plane 372(1), the driver circuit 374(2) can drive a third voltage on a seventh global access line associated with the memory plane 372(2), etc., and other voltages can be driven on each of the remaining global access lines. In some examples, pass voltages can be provided on all access lines except an access line associated with a page of a memory plane 372(0)-372(3) to be accessed. The local media controller 135, the driver circuits 374(0)-374(3) can allow different respective pages, and the page buffers 376(0)-376(3) within different respective blocks of memory cells, to be accessed concurrently. For example, a first page of a first block of a first memory plane can be accessed concurrently with a second page of a second block of a second memory plane, regardless of page type.

The page buffers 376(0)-376(3) can provide data to or receive data from the local media controller 135 during the memory access operations responsive to signals from the local media controller 135 and the respective memory planes 372(0)-372(3). The local media controller 135 can provide the received data to memory sub-system controller 115.

It will be appreciated that the memory device 130 can include more or less than four memory planes, driver circuits, and page buffers. It will also be appreciated that the respective global access lines can include 8, 16, 32, 64, 128, etc., global access lines. The local media controller 135 and the driver circuits 374(0)-374(3) can concurrently access different respective pages within different respective blocks of different memory planes when the different respective pages are of a different page type. For example, local media controller 135 can include a number of different processing threads, such as processing threads 334(0)-334(3). Each of processing threads 334(0)-334(3) can be associated with a respective one of memory planes 372(0)-372(3) and can manage operations performed on the respective plane. For example, each of processing threads 334(0)-334(3) can provide control signals to the respective one of driver circuits 374(0)-374(3) and page buffers 376(0)-376(3) to perform those memory access operations concurrently (e.g., at least partially overlapping in time).

In one embodiment, cache agent 134 receives and processes memory access commands, such as read commands, cache read commands, cache read context switch commands, snap read commands, and cache read context restore commands. In one embodiment, cache agent 134 receives a series of multiple cache read commands (e.g., sequential read commands) requesting first data from memory array 250 and spread across multiple memory planes 372(0)-372(3). For example, the cache read commands can request data from two or more of data blocks 382, 383, 384, or 385. Cache agent 134 further receives, from the requestor, a cache read context switch command and a snap read command requesting second data from one of memory planes 372(0)-372(3) of the memory array 250 of memory device 130. For example, the snap read command can request data from one of data blocks 382, 383, 384, or 385. Responsive to receiving the cache read context switch command, cache agent 134 can suspend processing of the cache read commands and being processing the snap read command to read the second data from the memory array 250 and return the second data to the requestor.

Figure 4:
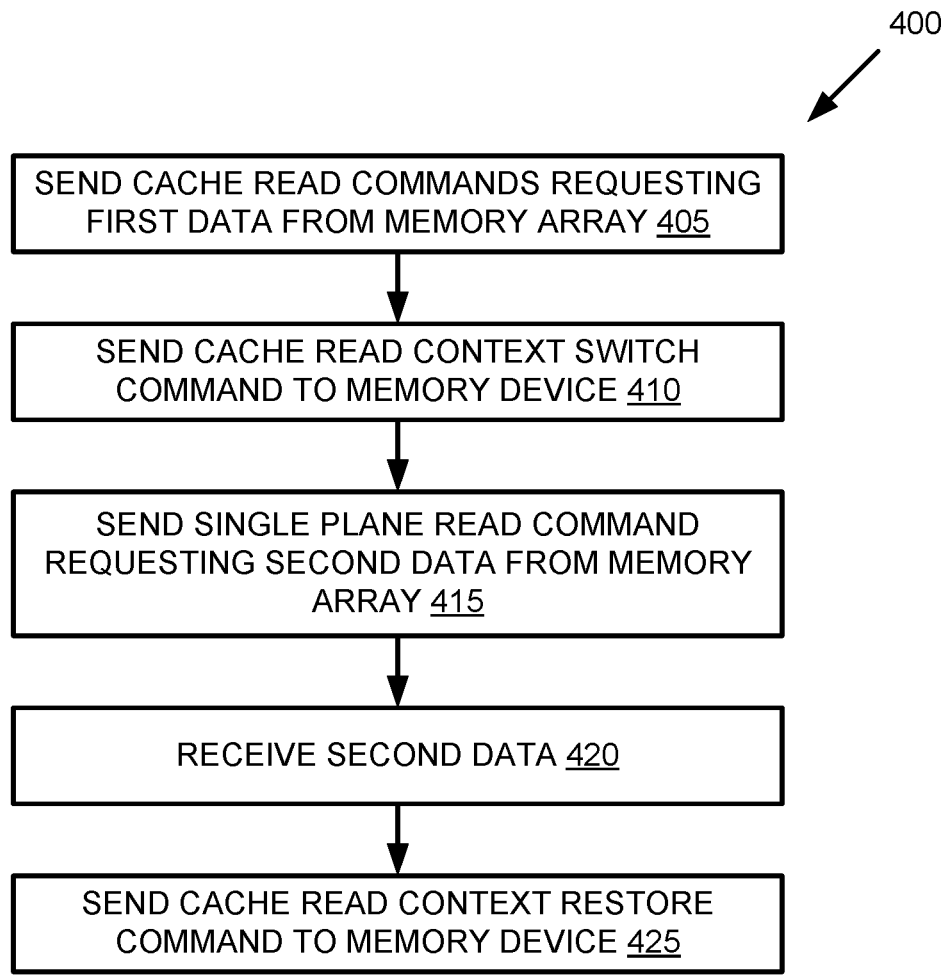
FIG. 4 is a flow diagram of an example method of issuing a cache read context switching command in accordance with some embodiments of the present disclosure.

FIG. 4 is a flow diagram of an example method of issuing a cache read context switching command in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by cache manager 114 of FIG. 1 and FIG. 2B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, a command is sent. For example, processing logic (e.g., cache manager 114) can send a memory access command/request, such as a cache read command, to a memory device, such as memory device 130. In one embodiment, the cache read command is one of a sequence of multiple cache read commands (e.g., sequential read commands) requesting first data from a memory array, such as memory array 250, and spread across a number of memory planes, such as memory planes 372(0)-372(3). In one embodiment, cache manager 114 can store the cache read commands in a hardware queue, such as command queue 248. In one embodiment, the cache read commands are stored in the command queue 248 with an indication of low priority. For example, the indication can be a single-bit or multi-bit value associated with each command, where the value includes a known pattern indicative of the low priority. In one embodiment, the low priority is indicated when the cache read commands are received (e.g., from host system 120). In another embodiment, cache manager 114 identifies the low priority according to the type of command received. In one embodiment, cache manager 114 issues commands from the command queue 248 according to the indicated priority level. If command queue 248 includes only low priority commands, then the cache read commands can be issued in the order in which they were received and stored in command queue 248. A cache agent 134 on memory device 130 can receive and process the cache read commands to read and return the first data.

At operation 410, a command is sent. For example, the processing logic can send a cache read context switch command to memory device 130. At operation 415, a command is sent. For example, the processing logic can send a snap read command to memory device 130. In one embodiment, the snap read command requests second data from one of memory planes memory planes 372(0)-372(3) of the memory array 250. A cache agent 134 on memory device 130 can process the cache read context switch command which causes the memory device to suspend processing of the cache read commands and begin processing the snap read command to read the second data from the memory array 250. In one embodiment, the cache read context switch command and single plane read command are stored in command queue 248. In one embodiment, the cache read context switch command and single plane read command are stored in the command queue 248 with an indication of high priority. For example, the indication can be a single-bit or multi-bit value associated with each command, where the value includes a known pattern indicative of the high priority. In one embodiment, the high priority is indicated when the commands are received (e.g., from host system 120). In another embodiment, cache manager 114 identifies the high priority according to the type of command received. cache manager 114 issues commands from the command queue 248 according to the indicated priority level. If command queue 248 includes high priority and low priority commands, then the high priority single plane read commands can be issued before at least one of the lower priority cache read commands enqueued before the high priority cache read context switch command and single plane read command.

At operation 420, data is received. For example, the processing logic can receive the data, such as the second data associated with the snap read command, from the memory device 130.

At operation 425, a command is sent. For example, the processing logic can send a cache read context restore command to memory device 130. A cache agent 134 on memory device 130 can process the cache read context restore command which causes the memory device to resume processing of the cache read commands.

Figure 5:
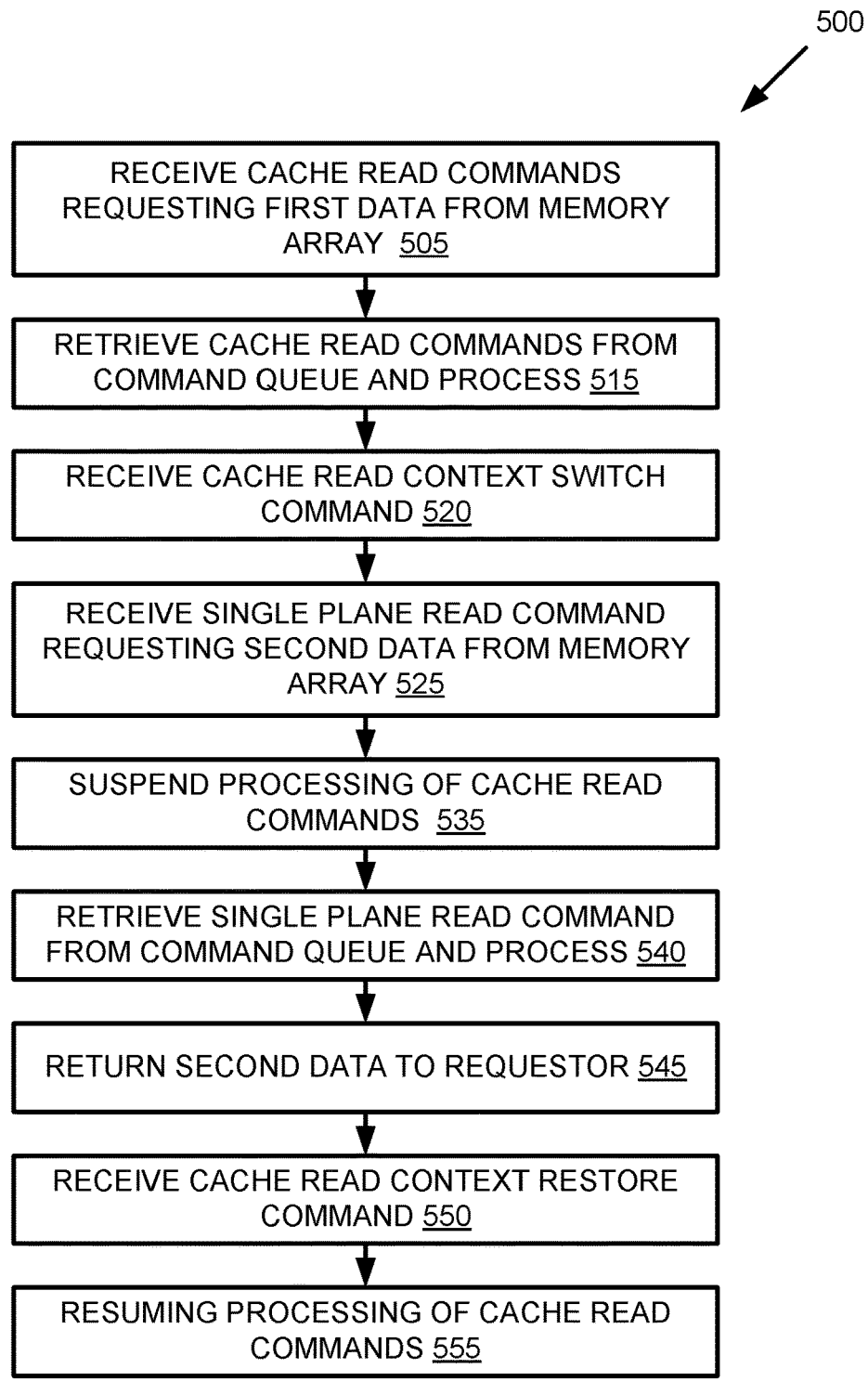
FIG. 5 is a flow diagram of an example method of processing a cache read context switching command in accordance with some embodiments of the present disclosure.

FIG. 5 is a flow diagram of an example method of processing a cache read context switching command in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by cache agent 134 of FIG. 1-FIG. 3. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 505, a command is received. For example, processing logic (e.g., cache agent 134) can receive a memory access command/request, such as a cache read command 502. In one embodiment, the cache read command is one of a sequence of multiple cache read commands (e.g., sequential read commands) requesting first data from a memory array, such as memory array 250, and spread across a number of memory planes, such as memory planes 372(0)-372(3), of memory device 130. In one embodiment, the cache read commands are received from a requestor, such as cache manager 114 of memory sub-system controller 115.

At operation 515, commands are processed. For example, the processing logic can receive the cache read commands and process the cache read commands. In one embodiment, as illustrated in FIG. 6A, to process the cache read commands, cache agent 134 can copy the first data from memory array 250 into one of data registers 244-246, and then into cache register 242, from where the first data can be output to the requestor. For example, data (e.g., Page N) associated with one cache read command can be in cache register 242, while data (e.g., Page N+1) associated with a subsequent cache read command can be in data register 244. In one embodiment, the data is read from memory array 250 via a sense amplifier (SA).

At operation 520, a command is received. For example, the processing logic can receive a cache read context switch command from the requestor. In one embodiment, the cache read context switch command is a unique memory command, which when processed, causes the memory device 130 to switch a command processing context. For example, if currently processing low priority sequential cache read commands, upon receipt of a cache read context switch command, the memory device 130 can switch to a high priority command processing context to identify incoming high priority memory access commands which can be processed out-of-order (e.g., before previously received cache read commands). In one embodiment, the read context switch command has a unique format or unique contents which are recognizable by the memory device 130 in order to identify the read context switch command.

At operation 525, a command is received. For example, the processing logic can receive a snap read command from the requestor. In one embodiment, the snap read command requests second data from one of memory planes memory planes 372(0)-372(3) of the memory array 250.

At operation 535, command processing is suspended. For example, the processing logic can suspend processing of the cache read commands. In one embodiment, a cache read command that is currently being processed can be allowed to complete, while processing of any remaining cache read commands is paused. In one embodiment, as illustrated in FIG. 6B, to suspend the command processing, cache agent 134 moves a portion of the first data associated with the cache read commands from cache register 242 of page cache 240 to data register 246 of the page cache 240. Thus, the portion of the data from the cache register 242 is preserved in the data registers 246 so that processing of the cache read commands can be resumed later, without the need to re-read the portion of the data from memory array 250. In one embodiment, the processing of the cache read commands is suspended upon receipt of the cache read context switch command at operation 520, and execution of the high priority cache read context switch command, which can occur either before or after receipt of the snap read command at operation 525.

At operation 540, a command is processed. For example, the processing logic can receive the snap read command and process the snap read command. In one embodiment, as illustrated in FIG. 6C, to process the snap read command, cache agent 134 can copy the second data (e.g., iWL Page) from memory array 250 into cache register 242 (i.e., bypassing the data registers 244-246 storing Page N and Page N+1), from where the first data can be output to the requestor. In one embodiment, the data is read from memory array 250 via a sense amplifier (SA).

At block 545, data is returned. For example, the processing logic can send the data, such as the second data associated with the snap read command, to the requestor (e.g., cache manager 114 of memory sub-system controller 115).

At block 550, a command is received. For example, the processing logic can receive a cache read context restore command from the requestor. In one embodiment, the cache read context restore command is a unique memory command, which when processed, causes the memory device 130 to revert to a prior command processing context. For example, if previously processing low priority sequential cache read commands, and having switched to a high priority command processing context, upon receipt of the cache read context restore command, the memory device 130 can revert to the prior command processing context and resume processing the sequential cache read commands. In one embodiment, the read context restore command has a unique format or unique contents which are recognizable by the memory device 130 in order to identify the read context restore command.

At operation 555, command processing is resumed. For example, the processing logic can resume processing of the cache read commands that was previously suspended. In one embodiment, cache agent 134 on memory device 130 can process the cache read context resume command which causes the memory device to resume processing of the cache read commands. In one embodiment, as illustrated in FIG. 6D, to resume the command processing, cache agent 134 moves the portion of the first data associated with the cache read commands from data register 246 of the page cache 240 back to cache register 242 of page cache 240. From there the portion of the data can be returned to the requestor, without the need to re-read the portion of the data from memory array 250.

Figure 7:
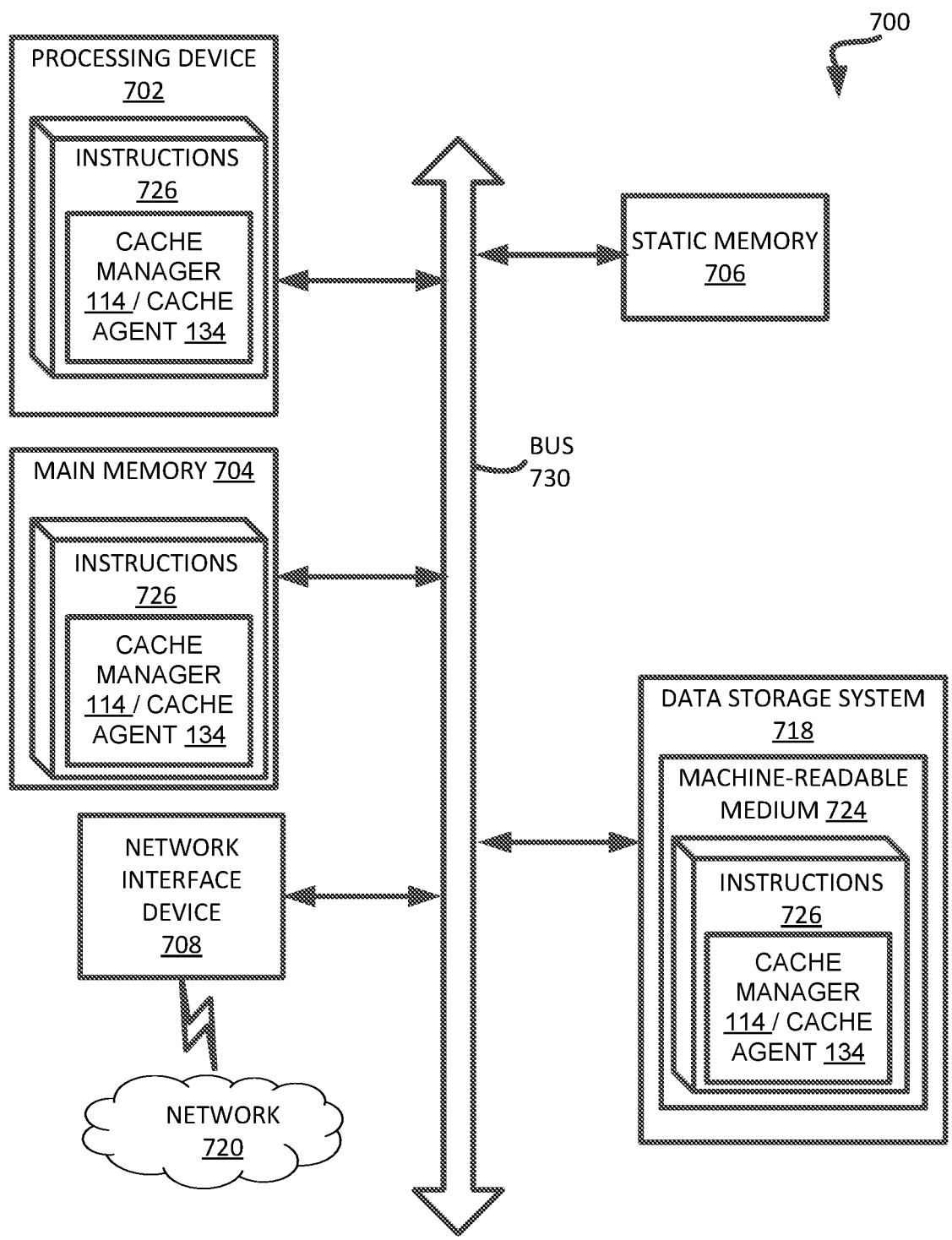
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to cache manager 114 and/or cache agent 134 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to cache manager 114 and/or cache agent 134 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array configured with a plurality of memory planes; and
control logic, operatively coupled with the memory array, to perform operations comprising:
receiving, from a requestor, a plurality of cache read commands requesting first data from the memory array spread across the plurality of memory planes;
receiving, from the requestor, a cache read context switch command and a snap read command requesting second data from a single plane of the plurality of memory planes of the memory array, wherein the cache read context switch command and the snap read command are stored in a command queue associated with the requestor with an indication of a higher priority than the plurality of cache read commands;
responsive to receiving the cache read context switch command, suspending processing of the plurality of cache read commands; and
processing the snap read command to read the second data from the single plane of the plurality of memory planes of the memory array and return the second data to the requestor.

2. The memory device of claim 1, wherein the requestor comprises a memory sub-system controller of a memory sub-system comprising the memory device.

3. The memory device of claim 1, wherein the cache read context switch command and the snap read command are received and processed before at least one cache read command stored in the command queue before the cache read context switch command and the snap read command.

4. The memory device of claim 1, further comprising:
a page cache comprising a cache register and a plurality of data registers.

5. The memory device of claim 4, wherein suspending processing of the plurality of cache read commands comprises moving a portion of the first data associated with the plurality of cache read commands from the cache register to one of the plurality of data registers.

6. The memory device of claim 5, wherein processing the snap read command comprises copying the second data associated with the snap read command from the memory array to the cache register.

7. The memory device of claim 5, wherein the control logic to perform further operations comprising:
receiving, from the requestor, a cache read context restore command; and
responsive to receiving the cache read context restore command, resuming processing of the plurality of cache read commands.

8. The memory device of claim 7, wherein resuming processing of the plurality of cache read commands comprises moving the portion of the first data associated with the plurality of cache read commands from the one of the plurality of data registers back to the cache register.

9. A method comprising:
receiving, at a memory device and from a requestor, a plurality of cache read commands requesting first data from a memory array of the memory device and spread across a plurality of memory planes of the memory array;
receiving, at the memory device and from the requestor, a cache read context switch command and a snap read command requesting second data from a single plane of the plurality of memory planes of the memory array, wherein the cache read context switch command and the snap read command are stored in a command queue associated with the requestor with an indication of a higher priority than the plurality of cache read commands;
responsive to receiving the cache read context switch command, suspending processing of the plurality of cache read commands; and
processing the snap read command to read the second data from the single plane of the plurality of memory planes of the memory array and return the second data to the requestor.

10. The method of claim 9, wherein the requestor comprises a memory sub-system controller of a memory sub-system comprising the memory device.

11. The method of claim 9, wherein the cache read context switch command and the snap read command are received and processed before at least one cache read command stored in the command queue before the cache read context switch command and the snap read command.

12. The method of claim 9, wherein suspending processing of the plurality of cache read commands comprises moving a portion of the first data associated with the plurality of cache read commands from a cache register of a page cache to one of a plurality of data registers of the page cache.

13. The method of claim 12, wherein processing the snap read command comprises copying the second data associated with the snap read command from the memory array to the cache register.

14. The method of claim 12, further comprising:
receiving, from the requestor, a cache read context restore command; and
responsive to receiving the cache read context restore command, resuming processing of the plurality of cache read commands.

15. The method of claim 14, wherein resuming processing of the plurality of cache read commands comprises moving the portion of the first data associated with the plurality of cache read commands from the one of the plurality of data registers back to the cache register.

16. A system comprising:
- a memory device comprising a memory array configured with a plurality of memory planes; and
- a processing device, operatively coupled with the memory device, to perform operations comprising:
  - sending, to the memory device, a plurality of cache read commands requesting first data from the memory array spread across a plurality of memory planes;
  - sending, to the memory device, a cache read context switch command and a snap read command requesting second data from a single plane of the plurality of memory planes of the memory array, the cache read context switch command to cause the memory device to suspend processing of the plurality of cache read commands and process the snap read command to read the second data from the single plane of the plurality of memory planes of the memory array, wherein the cache read context switch command and the snap read command are sent to the memory device with an indication of a higher priority than the plurality of cache read commands; and
  - receiving the second data from the memory device.

17. The system of claim 16, wherein to suspend processing of the plurality of cache read commands, the memory device is to move a portion of the first data associated with the plurality of cache read commands from a cache register of a page cache to one of a plurality of data registers of the page cache, and wherein to process the snap read command, the memory device is to copy the second data associated with the snap read command from the memory array to the cache register.

18. The system of claim 17, wherein the processing device is to perform operations further comprising:
- sending, to the memory device, a cache read context restore command, the cache read context restore command to cause the memory device to resume processing of the plurality of cache read commands.

19. The system of claim 18, wherein to resume processing of the plurality of cache read commands, the memory device is to move the portion of the first data associated with the plurality of cache read commands from the one of the plurality of data registers back to the cache register.

* * * * *